United States Patent
Joseph et al.

[11] Patent Number: 5,954,301
[45] Date of Patent: Sep. 21, 1999

[54] CABLE MANAGEMENT UNIT

[75] Inventors: Michael Joseph, Nashua, N.H.; Norman J. Wainio, Milford; Michael Romm, Brighton, both of Mass.

[73] Assignee: Cabletron Systems, Inc., Rochester, N.H.

[21] Appl. No.: 08/754,735

[22] Filed: Nov. 21, 1996

[51] Int. Cl.⁶ ................................................ F16L 3/22
[52] U.S. Cl. .................................................... 248/68.1
[58] Field of Search ................. 248/68.1, 49; 439/713; 174/65 R

[56] References Cited

U.S. PATENT DOCUMENTS

| | | | |
|---|---|---|---|
| 4,962,989 | 10/1990 | Jung et al. | 248/68.1 |
| 5,060,810 | 10/1991 | Jones | 248/68.1 |
| 5,224,674 | 7/1993 | Simons | 248/68.1 |
| 5,575,665 | 11/1996 | Shramawick et al. | 439/713 |

*Primary Examiner*—Ramon O. Ramirez
*Assistant Examiner*—Willie Berry, Jr.
*Attorney, Agent, or Firm*—Wolf, Greenfield & Sacks

[57] ABSTRACT

A cable management unit having a tray-divider/rack mount tray adapted to mate with a clamp/cable organizer. The clamp/cable organizer has a several mounting ears adapted to mate with a corresponding number of slide receipt openings in the tray-divider/rack mount tray. The tray-divider/rack mount tray includes a generally planar base, the base containing a plurality of openings to accommodate a plurality of bundling straps, two slide sections, each of the slide sections being formed as downward vertical extensions to the base and extending at a ninety degree angle from the base and each including a slide receipt opening, and two sets of mounting ears, each one of the sets formed from a corresponding slide section, each one of the sets providing attachment means to a rack.

16 Claims, 4 Drawing Sheets

Fig. 3
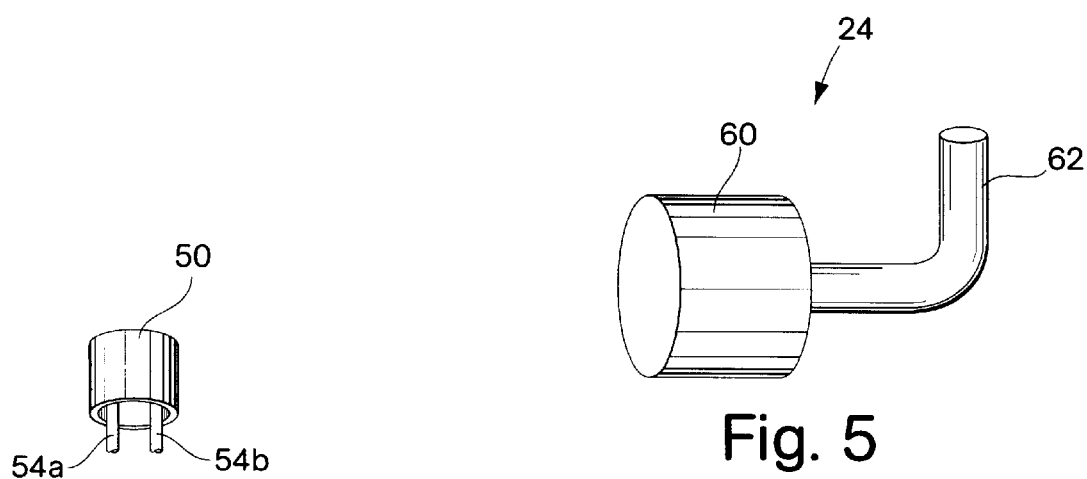
Fig. 4
Fig. 5

CABLE MANAGEMENT UNIT

BACKGROUND OF THE INVENTION

The present invention relates to the field of electronic cabling, and more particularly to the field of cable management employed in organizing building telecommunication wiring.

As is known in the art, electronic cabling such as those found in telecommunications cabling, requires support and organization in an orderly fashion to promote efficient distribution and maintenance of the cabling throughout a building. Telephone and data cables in the building, for example, interconnect telephone handsets and computer terminals located at desks and offices throughout the building with each other and with centralized communication facilities, including trunk lines, network servers, and PBX equipment.

To permit flexibility in configuring and later changing the interconnections, cables are run from each telephone, computer, trunk line, PBX, server, and other devices, to a central interconnection "closet." The end of each wire of a cable is connected to terminals in a patch cord. Typically, the interconnection closet consists of two groups of cables, i.e., patch cords and building wiring.

Setting up and maintaining an interconnection closet is a complex endeavor because present systems may consist of up to 500 or more cables. One approach to aid in the management of such a large number of cables, for example, is to use a cable organizer, which may be either rack or wall mountable, to route and secure cables. Such an approach manages one of the two groups of cables, i.e., patch cords.

Another approach to this problem to is incorporate a tray for securing cables in the patch cord design. Still another approach has been to provide a device that has a provision for routing cables either installed behind the patch cord or underneath, and in some cases on the side rails in relay racks or cabinets. With either approach, means is only provided for separating one of the two major "cable traffic" bundles, i.e., patch cords.

In still another approach, bundles of wires are wrapped with cable ties and placed in cabinets. With this approach, cables are not separated in any designated fashion or organized in any logical manner, but grouped together in a random fashion as a bundle. Maintaining such a bundle requires removal of the cable ties and rebundling upon completion.

SUMMARY OF THE INVENTION

In general, in one aspect, the invention features a cable management unit having a tray-divider/rack mount tray adapted to mate with a clamp/cable organizer. The clamp/cable organizer has a several mounting ears adapted to mate with a corresponding number of slide receipt openings in the tray-divider/rack mount tray. Among the advantages of such an arrangement, the cable management unit serves as a simple and inexpensive solution for dividing two main groups of cables in a system, i.e., patch cords and building wiring. In addition, the arrangement provides cable management support for the patch cords and building wiring by securing single cables in a clamp and tightening bundles of cables above and beneath the unit.

BRIEF DESCRIPTION OF THE DRAWINGS

The novel features believed characteristic of the invention are set forth in the appended claims. The invention itself, however, as well as other features and advantages there of, will be best understood by reference to the detailed description of specific embodiments which follows, when read in conjunction with the accompanied drawings, wherein:

FIG. 3 is a side view of a clamp/cable organizer;

FIG. 4 is a prospective view of a circular bearing;

FIG. 5 is a prospective view of a locking mechanism of the clamp/cable organizer.

DESCRIPTION OF THE PREFERRED EMBODIMENTS

Figure 1:
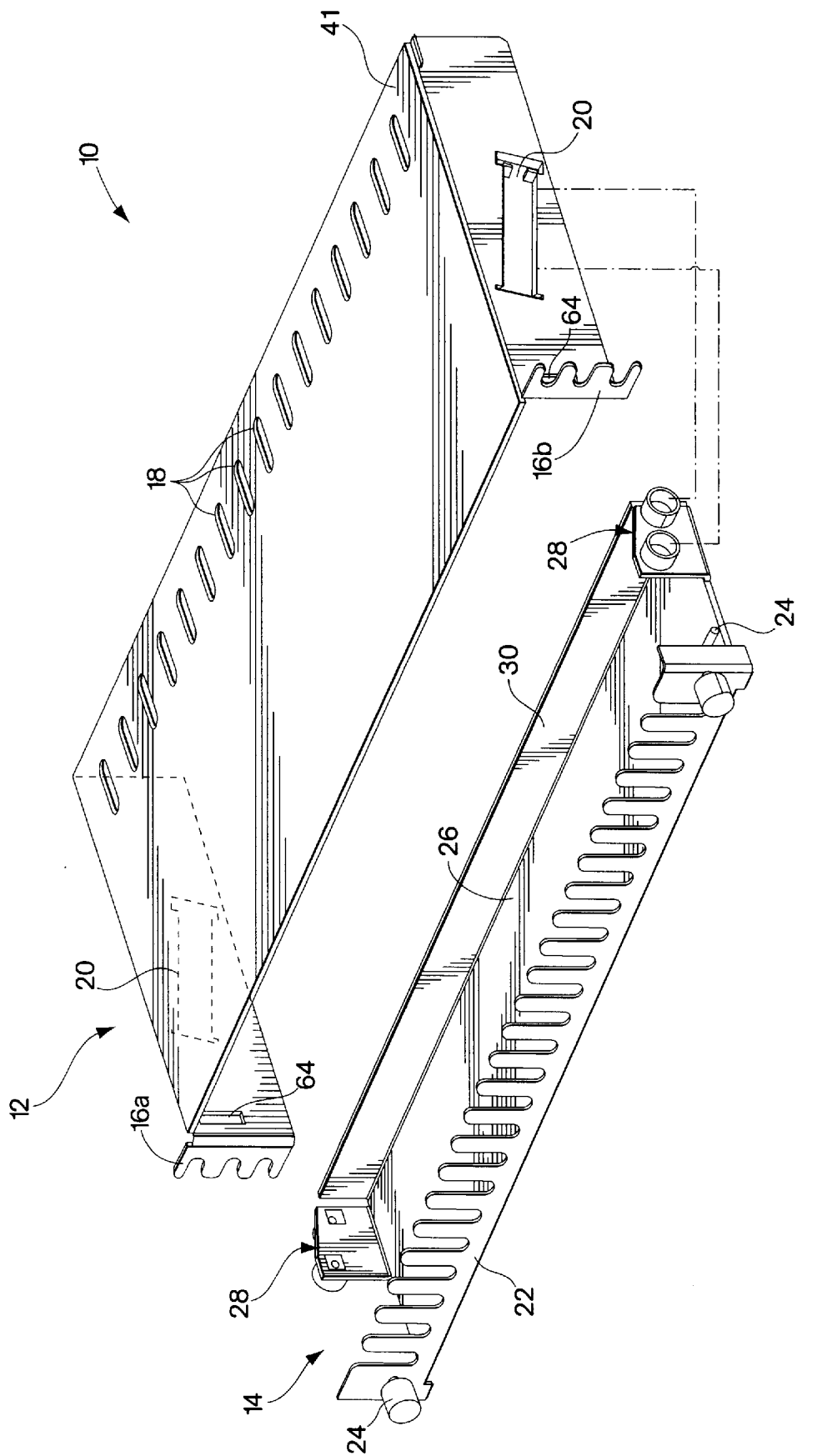
FIG. 1 is a prospective view of a cable divider unit in accordance with the present invention.

Referring to FIG. 1, a cable divider unit 10 is shown to include a tray-divider/rack mount tray 12 and a clamp/cable organizer 14. The cable divider can be made from any rigid material, such as steel. The tray-divider/rack mount tray 12 is shown to include two sets of mounting ears, labeled as 16a and 16b respectively, a series of rear openings, labeled as 18, and two slide receipt openings 20 (more filly described with reference to FIG. 2 below).

Each of the rear openings 18 of the tray-divider/rack mount tray 12 provide an area to be used for a variety of cable ties (not shown). The mounting ears 16a and 16b provide a means of attaching the cable divider unit 10 to a rack or cabinet (not shown).

The clamp/cable organizer 14 is shown to include separation face 22, two locking mechanisms 24, a base 26, two mount units 28, and a rear wall 30. The slide receipt openings 20 provide receipt for the two mount units 28, thus joining the tray-divider/rack mount tray 12 and the clamp/cable organizer 14 to form the cable divider unit 10. The separation face 22 is formed from the organizer 14 as a series of fingers which provide separation to active cable (not shown).

Figure 2:
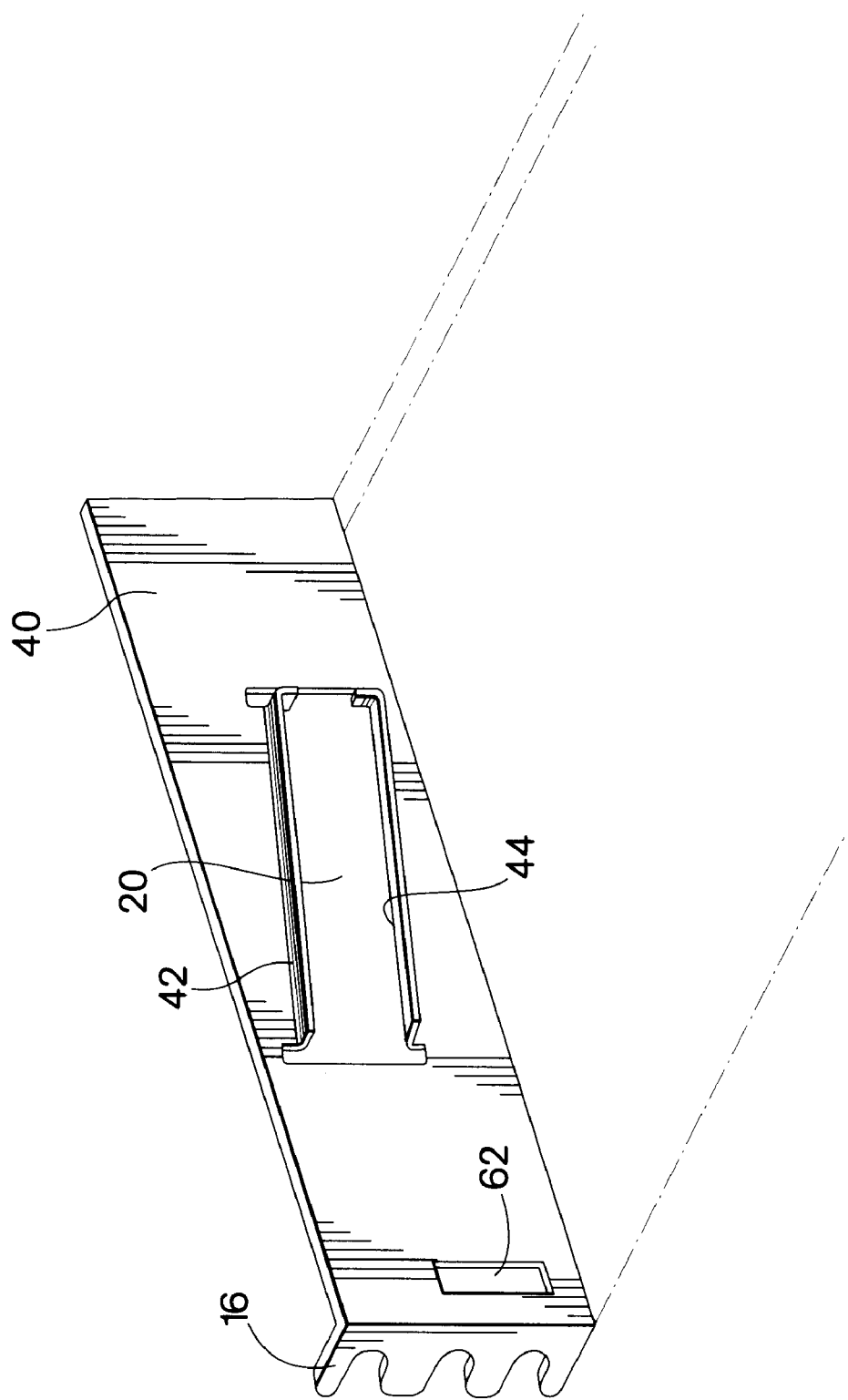
FIG. 2 is a prospective view of a slide section of a tray-divider/rack mount tray 12.

Referring to FIG. 2, the slide receipt opening 20 is shown to be formed in a slide section 40 of the tray-divider/rack mount tray 12. This slide section 40 is formed from a base portion 41 extending downwardly ninety degrees and contains one set of the mounting ears 16, as was described with referenced to FIG. 1. The slide receipt opening 20 is shown having an upper rail 42 and a lower rail 44. The upper 42 and lower rail 44 are formed from the slide section 40 and oriented ninety degrees from it. With such an arrangement, the mount unit 28 mates within the slide receipt opening 20 to join the tray-divider/rack mount tray 12 to the clamp/cable organizer 14, thus forming the cable divider unit 10.

In operation, the slide receipt opening 20 is oriented at an angle so as to provide the mount unit 28 an ability to slide back and forth. In the back position, the clamp/cable organizer 14 is in the open position and cable may be moved freely about. In the forward position, the clamp/cable organizer 14 is in the closed position and cable is in a fixed or secured position.

Referring to FIG. 3, a cross sectional end view of the clamp/cable organizer 14 shows the mount unit 28 in greater detail. The mount unit 28 includes a mount wall 50 formed from the base 26 and oriented ninety degrees from the base 26. The mount wall 50 includes circular bearings 52. The circular bearings 52 are positioned outwardly from the mount wall 50 so that they may seat themselves and freely move within the slide receipt opening 20. The circular bearings 52 are preferably made from polypropylene.

Referring now to FIG. 4, the circular bearing 52 of FIG. 3 is shown to contain two projections 54a and 54b which allow the circular bearing to snap into the openings in the mount wall 50.

Referring again to FIG. 3, the clamp/cable organizer 14 also includes the locking mechanism 24. Referring now to FIG. 5, the locking mechanism 24 includes a handle 60 and an arm 62. Pivoting the locking mechanism 24 ninety degrees allows the arm 62 to enter a lock opening 64 in the slide section 40, securing the clamp/cable organizer 14 to the tray-divider/rack mount tray 12. The handle made be made of any hard plastic material, while the arm is typically made from steel.

Figure 6:
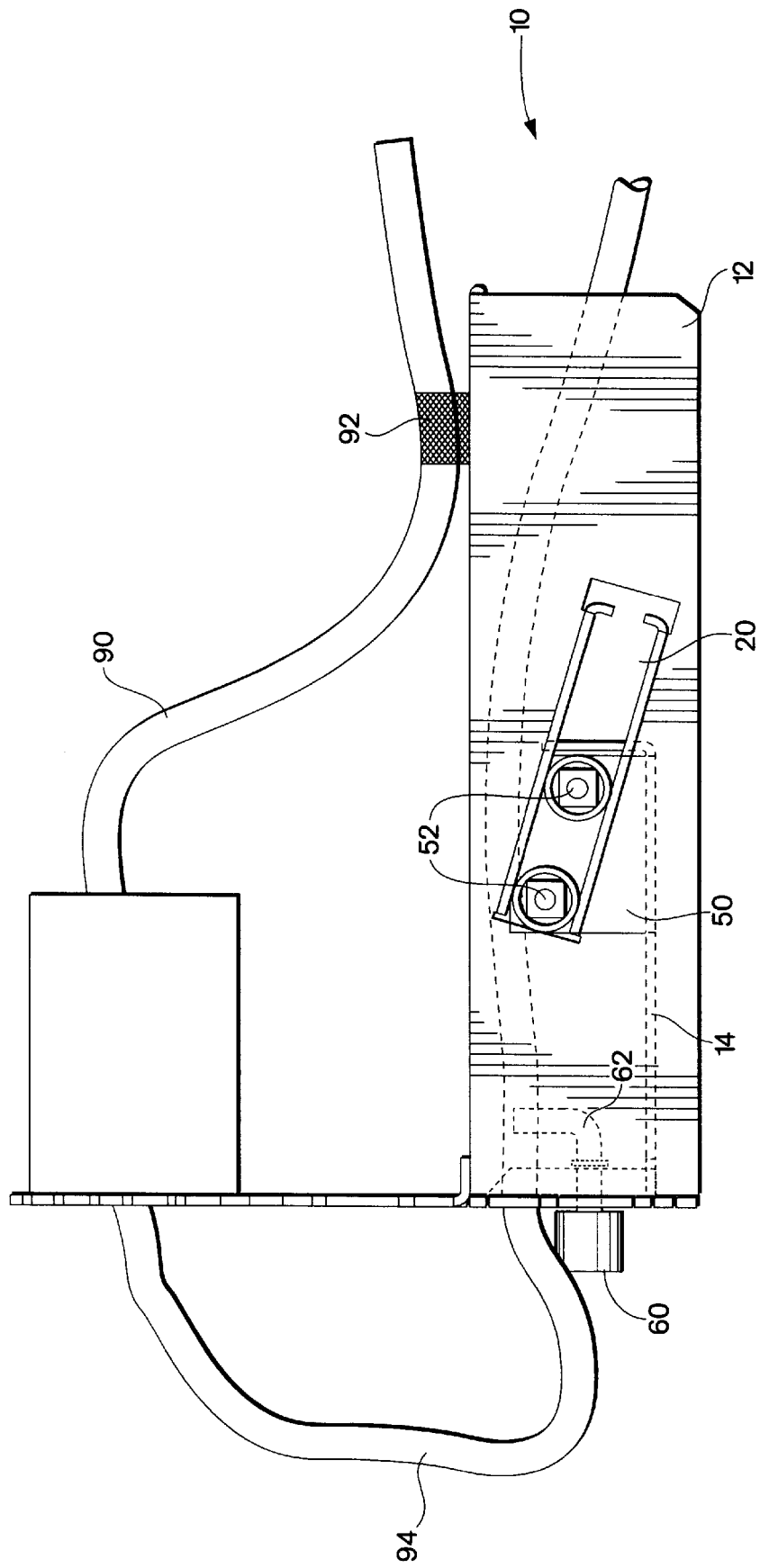
FIG. 6 is a side view of the cable divider unit.

Referring to FIG. 6, to use the cable divider unit 10, building wiring cables 90 are dressed to its top side and the resulting bundles secured with fasteners 92, such as Velcro, using the rear openings 18. The bundle is secured, patch cords 94 from active products are routed underneath the tray-divider/rack mount tray 12 and above clamp/cable organizer 14. The patch cords 94 are then spread out and the clamp/cable organizer 14 locked into its closed position, thus securing the patch cords 94.

Having described a preferred embodiment of the invention, it will now become apparent, to one skilled in the art that other embodiments incorporating its concepts may be used. It is felt therefore, that this embodiment should not be limited to the disclosed embodiment, but rather should be limited only by the spirit and scope of the appended claims.

What is claimed is:

1. A cable management unit comprising:

a tray-divider/rack mount tray; and a clamp/cable organizer, the clamp/cable organizer having at least one mounting unit adapted to slidably mate with at least one slide receipt opening in the tray-divider/rack mount tray, wherein the tray-divider/rack mount tray comprises:

a generally planar base, the base including a plurality of openings to accommodate a plurality of bundling straps;

at least one slide section, the at least one slide section being formed as an extension to the base and including the at least one slide receipt opening; and at least one mounting ear formed on the at least one slide section for providing attachment means to a rack.

2. The cable management unit according to claim 1, wherein the at least one slide receipt opening comprises an upper rail and a lower rail defining an opening.

3. A cable management unit comprising:

a tray-divider/rack mount tray; and a clamp/cable organizer, the clamp/cable organizer having at least one mounting unit adapted to slidably mate with at least one slide receipt opening in the tray-divider/rack mount tray, wherein the at least one slide receipt opening comprises an upper rail and a lower rail defining an opening.

4. The cable management unit according to claim 3, wherein the tray-divider/rack mount tray comprises:

a generally planar base, the base including a plurality of openings to accommodate a plurality of bundling straps;

at least one slide section, the at least one slide section being formed as an extension to the base and including the at least one slide receipt opening; and at least one mounting ear formed on the at least one slide section for providing attachment means to a rack.

5. A cable management unit comprising:

a tray-divider/rack mount tray; and a clamp/cable organizer, the clamp/cable organizer having at least one mounting unit adapted to slidably mate with at least one slide receipt opening in the tray-divider/rack mount tray, wherein the clamp/cable organizer comprises:

a generally planar clamp/cable organizer base, the base including:

a separation face formed from the base and including at least one locking mechanism located at at least one end of the face to lock the clamp/cable organizer to the tray-divider/rack mount tray;

a rear wall extending perpendicularly to the base; and at least one mount unit coupled to the base.

6. The cable management unit according to claim 5 wherein the at least one mount unit comprises:

a wall mount extending from the base, the wall mount having a plurality of openings; and a plurality of circular bearings adapted to mate to each of the openings.

7. The cable management unit according to claim 6 wherein the circular bearings are formed from polypropylene.

8. The cable management unit according to claim 5 wherein the at least one locking mechanism comprises:

a circular handle; and a rod, one end of which is attached to the handle.

9. The cable management unit according to claim 5, wherein the at least one slide receipt opening comprises an upper rail and a lower rail defining an opening.

10. The cable management unit according to claim 9, wherein the at least one locking mechanism comprises:

a circular handle; and a rod, one end of which is attached to the handle.

11. The cable management unit according to claim 9, wherein the at least one mount unit comprises:

a wall mount extending from the base, the wall mount having a plurality of openings; and a plurality of circular bearings adapted to mate to each of the openings.

12. The cable management unit according to claim 11, wherein the circular bearings are formed from polypropylene.

13. The cable management unit according to claim 5, wherein the tray-divider/rack mount tray comprises:

a generally planar base, the base including a plurality of openings to accommodate a plurality of bundling straps;

at least one slide section, the at least one slide section being formed as an extension to the base and including the at least one slide receipt opening; and at least one mounting ear formed on the at least one slide section for providing attachment means to a rack.

14. The cable management unit according to claim 13, wherein the at least one locking mechanism comprises:

a circular handle; and a rod, one end of which is attached to the handle.

15. The cable management unit according to claim 13, wherein the at least one mount unit comprises:

a wall mount extending from the base, the wall mount having a plurality of openings; and a plurality of circular bearings adapted to mate to each of the openings.

16. The cable management unit according to claim 15, wherein the circular bearings are formed from polypropylene.

* * * * *